United States Patent
Kakinuma

(10) Patent No.: US 11,794,384 B2
(45) Date of Patent: Oct. 24, 2023

(54) PROTECTIVE MEMBER FORMING APPARATUS

(71) Applicant: DISCO CORPORATION, Tokyo (JP)

(72) Inventor: Yoshinori Kakinuma, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/380,556

(22) Filed: Jul. 20, 2021

(65) Prior Publication Data

US 2022/0024085 A1 Jan. 27, 2022

(30) Foreign Application Priority Data

Jul. 22, 2020 (JP) .................................. 2020-125792

(51) Int. Cl.
| | |
|---|---|
| B29C 43/52 | (2006.01) |
| B29C 43/18 | (2006.01) |
| B81C 1/00 | (2006.01) |
| B29L 31/00 | (2006.01) |

(52) U.S. Cl.
CPC .............. B29C 43/52 (2013.01); B29C 43/18 (2013.01); B81C 1/00825 (2013.01); B81C 1/00896 (2013.01); *B29C 2043/189* (2013.01); *B29C 2043/525* (2013.01); *B29L 2031/756* (2013.01); *B81C 2201/053* (2013.01)

(58) Field of Classification Search
CPC ... B29C 43/25; B29C 43/18; B29C 2043/189; B81C 1/00825; B81C 1/00896; H01L 21/67132; H01L 21/67115
USPC ......................................................... 156/379
See application file for complete search history.

(56) References Cited

U.S. PATENT DOCUMENTS

| | | | |
|---|---|---|---|
| 2011/0052833 A1* | 3/2011 | Hanawa | ............ C23C 16/45574 134/1.1 |
| 2018/0253012 A1* | 9/2018 | Matsuo | ................. G03F 7/0002 |

FOREIGN PATENT DOCUMENTS

| | | | |
|---|---|---|---|
| EP | 1147870 A2 * | 10/2001 | ........... B29C 33/428 |
| JP | 2017050536 A | 3/2017 | |
| JP | 2017168565 A | 9/2017 | |

OTHER PUBLICATIONS

Fujisawa (English Translation of JP2013042017) (Year: 2013).*
Kazutaka (English Translation of JP2017168565A) (Year: 2017).*

* cited by examiner

*Primary Examiner* — Matthew J Daniels
*Assistant Examiner* — Hana C Page
(74) *Attorney, Agent, or Firm* — Greer, Burns & Crain, Ltd.

(57) ABSTRACT

A protective member forming apparatus includes an ultraviolet radiation applying table that supports a workpiece on a support surface of a support plate thereof through which ultraviolet rays are transmittable, a delivery unit that holds a resin sheet to which the workpiece is fixed, to unload the workpiece from the ultraviolet radiation applying table, a resin supply unit that supplies an ultraviolet-curable liquid resin to the resin sheet placed on the support surface, a pressing unit that presses the workpiece from a reverse side thereof toward the liquid resin supplied to the resin sheet placed on the support surface, and an ionizer unit that ejects ionized air to the support surface of the ultraviolet radiation applying table.

5 Claims, 7 Drawing Sheets

PROTECTIVE MEMBER FORMING APPARATUS

BACKGROUND OF THE INVENTION

Field of the Invention

The present invention relates to a protective member forming apparatus.

Description of the Related Art

Processes of manufacturing semiconductor device chips and various kinds of electronic parts include steps of thinning down a plate-shaped workpiece such as a wafer with various devices formed thereon and dividing such a plate-shaped workpiece into device chips. The workpiece is processed while being held on a chuck table. To prevent the workpiece from being broken when it is processed, the workpiece has its face side protected by a resin sheet such as an adhesive tape or a substrate that is affixed to the face side.

If a workpiece to be processed has surface irregularities such as metal electrode bumps on its face side, then it is difficult to affix an adhesive tape to the surface irregularities in intimate contact therewith, and swarf and a processing fluid tend to enter gaps between the surface irregularities and the adhesive tape affixed thereto. Therefore, the adhesive tape is easily peeled off from the surface irregularities. Further, since the adhesive tape is unable to absorb the surface irregularities sufficiently, when the reverse side of the workpiece is ground to thin down the workpiece, the surface irregularities tend to be transferred to the workpiece. As a solution to this difficulty, there has been devised a processing method in which a liquid resin that is curable by an external stimulus such as an ultraviolet radiation is applied to form a flat layer as a protective member (see, for example, Japanese Patent No. 6312343 and Japanese Patent Laid-open No. 2017-168565).

SUMMARY OF THE INVENTION

The liquid resin used in the processing method disclosed in Japanese Patent No. 6312343 or Japanese Patent Laid-open No. 2017-168565 is supplied to a protective sheet of resin laid on an ultraviolet radiation applying table of glass and is spread by pressing the workpiece, and then, an ultraviolet radiation is applied to cure the liquid resin. The protective sheet and the liquid resin thus cured thereon jointly make up a protective member (actually, a protective film is held in close contact with the face side of the workpiece, keeping the liquid resin and the workpiece out of contact with each other).

When the protective sheet with the workpiece fixed thereto is held and unloaded from the ultraviolet radiation applying table, an intensive peeling charge occurs between the glass of the ultraviolet radiation applying table and the resin of the protective sheet, and a next protective sheet spread over the ultraviolet radiation applying table is caused to be held in intimate contact with the ultraviolet radiation applying table and hence to fail to be unloaded from the ultraviolet radiation applying table.

It is therefore an object of the present invention to provide a protective member forming apparatus that is capable of reducing the difficulty in unloading a workpiece with a protective member formed on one surface thereof.

In accordance with an aspect of the present invention, there is provided a protective member forming apparatus that forms a protective member on a surface of a plate-shaped workpiece. The protective member forming apparatus includes an ultraviolet radiation applying table that supports the workpiece on a support surface of a support plate thereof through which ultraviolet rays from an ultraviolet radiation source disposed in the ultraviolet radiation applying table are transmittable, a sheet placement unit that places, on the support surface, a sheet that is larger than the workpiece and through which the ultraviolet rays are transmittable, a resin supply unit that supplies an ultraviolet-curable liquid resin to the sheet placed on the support surface, a pressing unit that presses the workpiece from another surface thereof toward the liquid resin supplied to the sheet placed on the support surface, an unloading unit that holds the sheet to which the workpiece is fixed with the liquid resin cured by the ultraviolet rays being interposed therebetween, and unloads the workpiece from the ultraviolet radiation applying table, and an ionizer unit that ejects ionized air to the support surface of the ultraviolet radiation applying table. When the sheet is spaced from the support surface by the unloading unit, the ionized air ejected from the ionizer unit is introduced along the support surface into a gap between the sheet and the support surface.

Preferably, the protective member forming apparatus further includes a light blocking cover including a light blocking member that covers a space over the support surface of the ultraviolet radiation applying table, and a light blocking shutter that opens and closes a portion of the light blocking cover to allow the unloading unit to enter the space. When the light blocking shutter opens the portion of the light blocking cover, part of the ionized air ejected from the ionizer unit is applied in such an orientation as to press an end region of the sheet near the light blocking shutter against the support surface.

The protective member forming apparatus according to the present invention is advantageous in that it is capable of reducing the difficulty in unloading a workpiece with a protective member formed on a surface thereof.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will hereinafter be described in detail with reference to the drawings. The present invention is not limited to the details of the embodiment described below. In addition, the components described below cover those which could easily be anticipated by a person skilled in the art and those which are essentially identical to those described above. Further, the arrangements described below can be combined in appropriate manners. Also, various omissions, replacements, or changes of the arrangements may be made without departing from the scope of the present invention.

Figure 1:
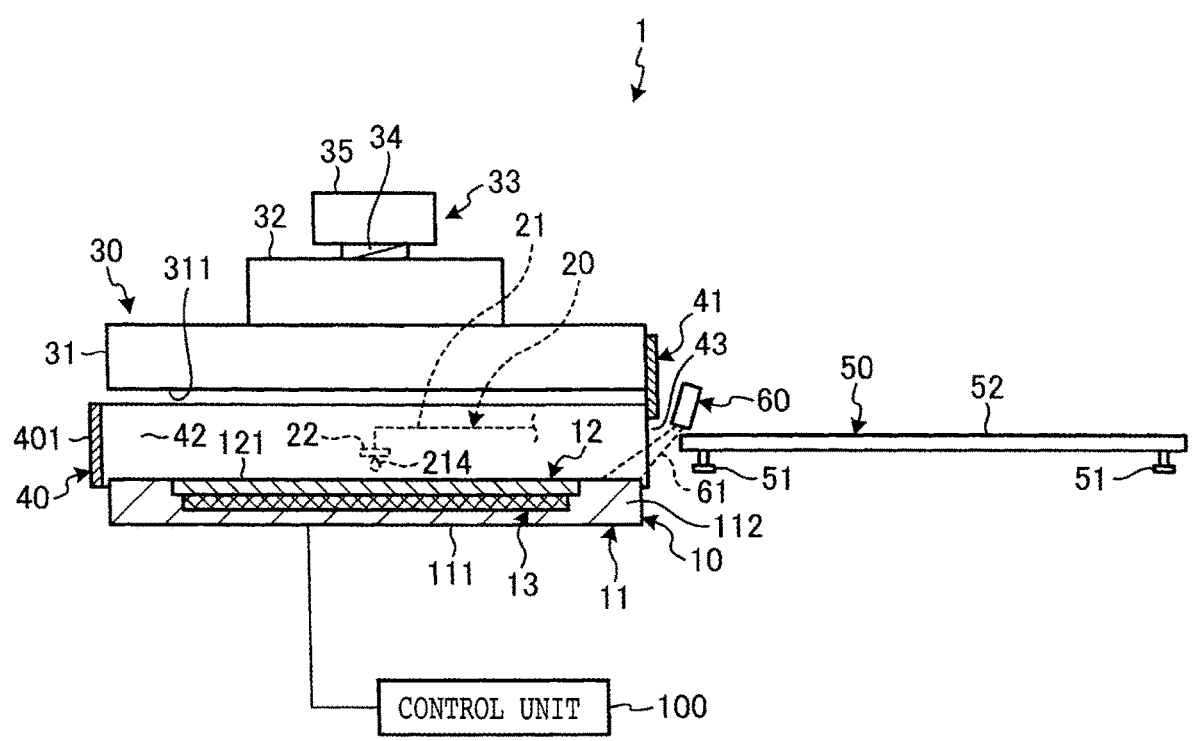
FIG. 1 is a side elevational view, partly in cross section, schematically illustrating a structural example of a protective member forming apparatus according to an embodiment of the present invention.
Figure 2:
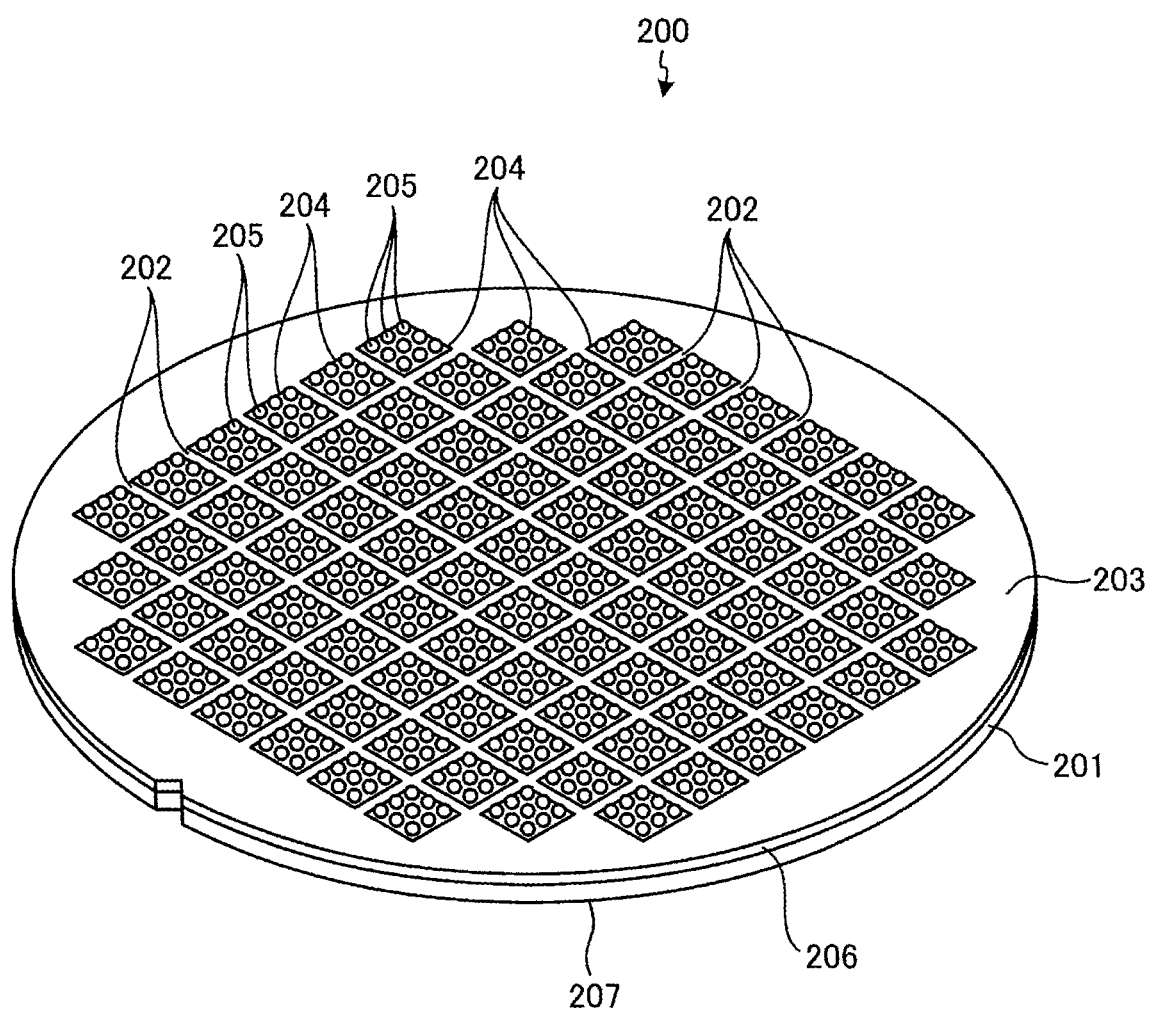
FIG. 2 is a perspective view of a workpiece on which a protective member is to be formed by the protective member forming apparatus illustrated in FIG. 1.
Figure 3:
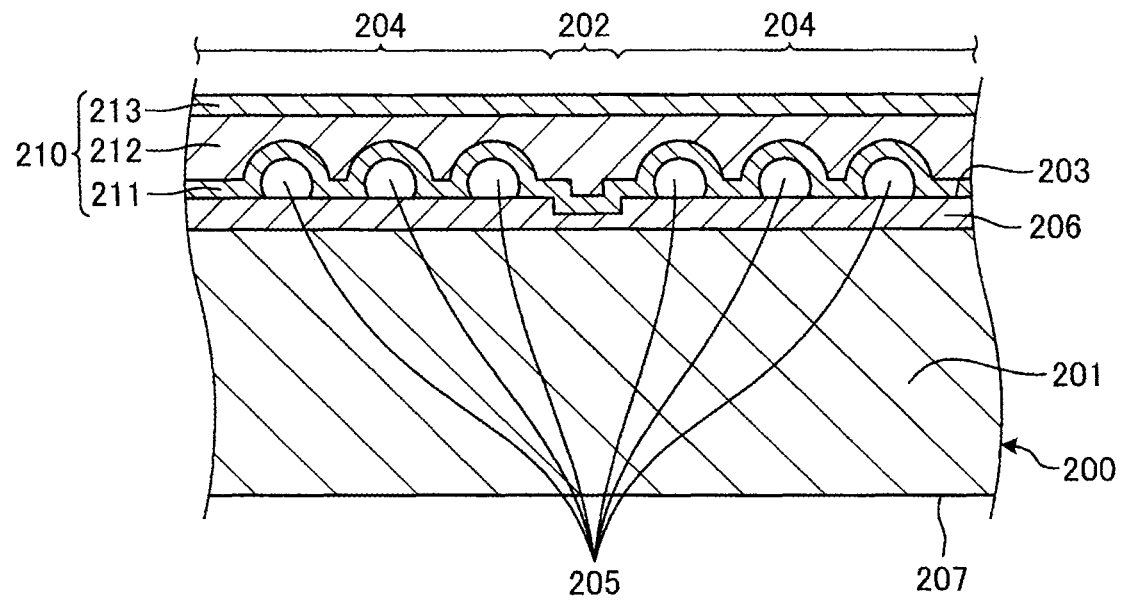
FIG. 3 is an enlarged fragmentary cross-sectional view of the workpiece illustrated in FIG. 2, with a protective member formed thereon.
Figure 4:
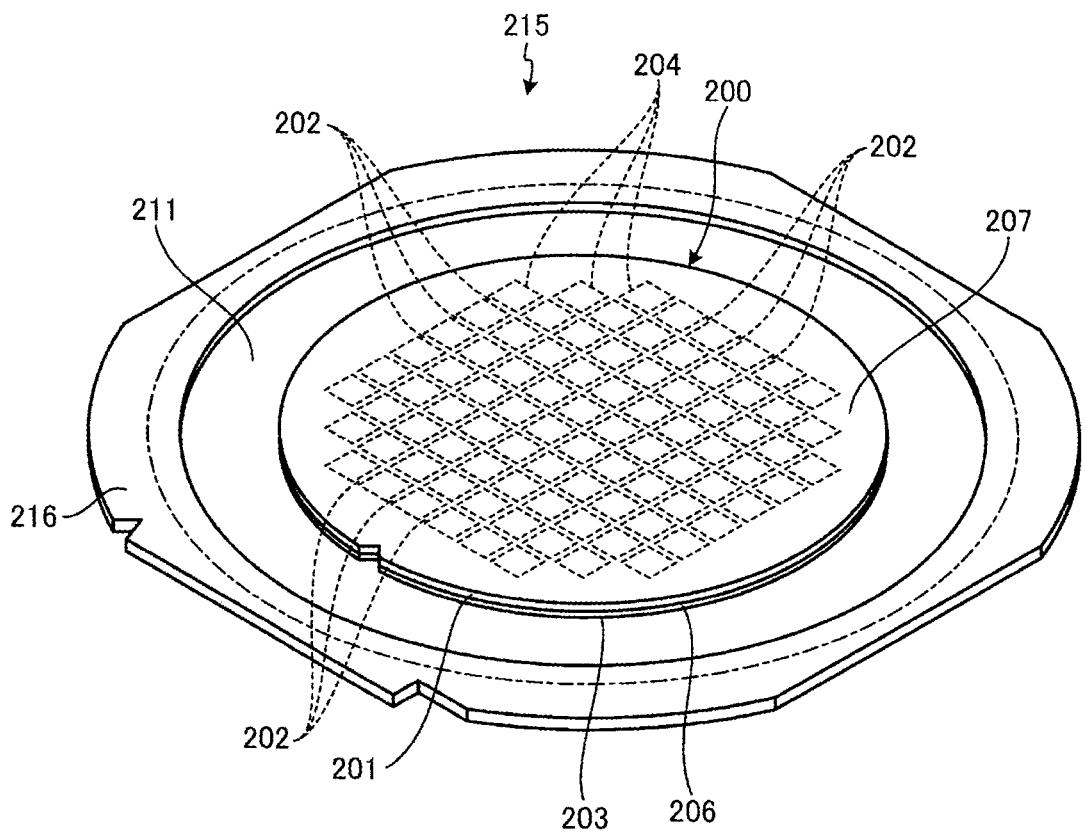
FIG. 4 is a perspective view of a frame unit including the workpiece illustrated in FIG. 2.
Figure 5:
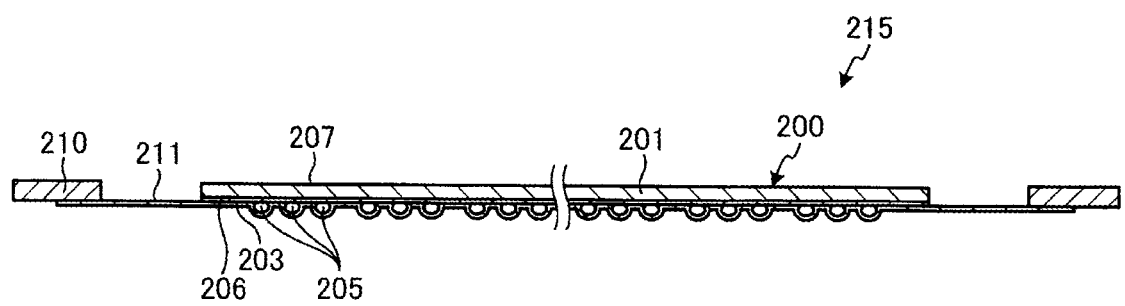
FIG. 5 is a cross-sectional view of the frame unit illustrated in FIG. 4.
Figure 6:
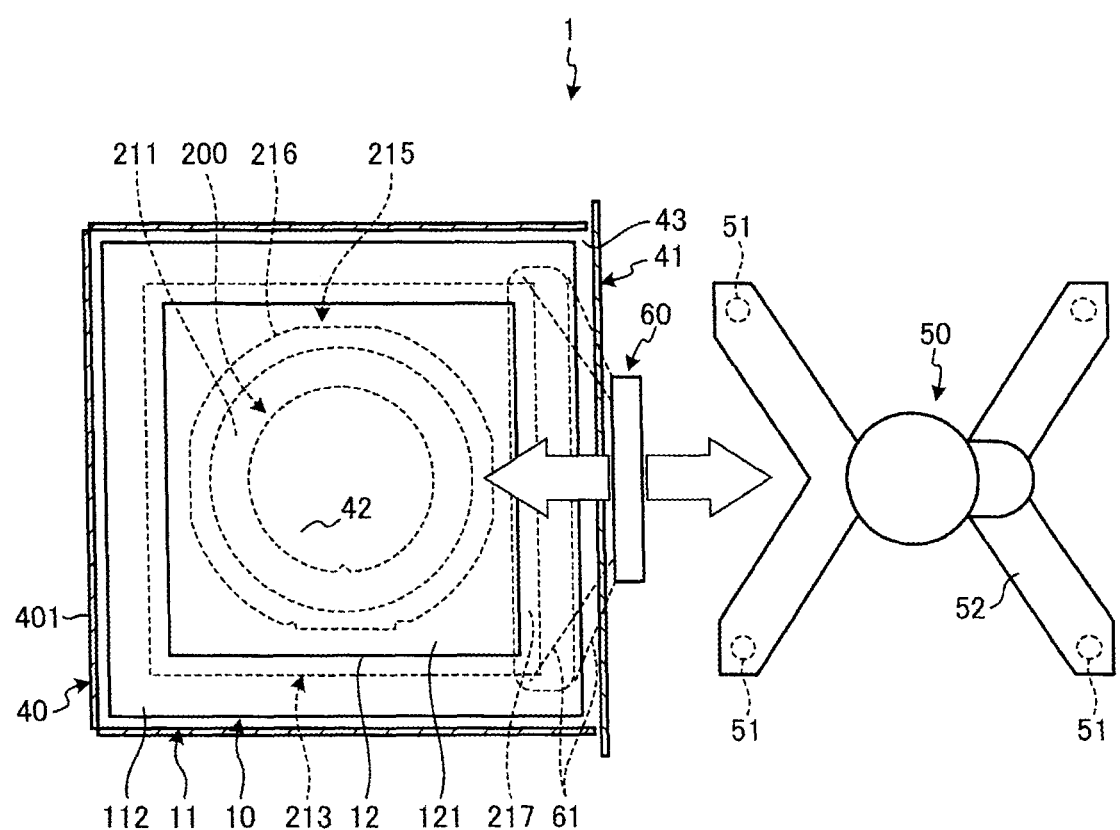
FIG. 6 is a plan view, partly in cross section, of a portion of the protective member forming apparatus illustrated in FIG. 1.

A protective member forming apparatus according to the embodiment of the present invention will be described in detail below with reference to the drawings. FIG. 1 schematically illustrates, in side elevation and partly in cross section, a structural example of the protective member forming apparatus according to the embodiment of the present invention. FIG. 2 illustrates, in perspective, a workpiece on which a protective member is to be formed by the protective member forming apparatus illustrated in FIG. 1. FIG. 3 illustrates, in enlarged fragmentary cross section, the workpiece illustrated in FIG. 2, with a protective member formed thereon, and FIG. 4 illustrates, in perspective, a frame unit including the workpiece illustrated in FIG. 2. FIG. 5 illustrates, in cross section, the frame unit illustrated in FIG. 4. FIG. 6 illustrates, in plan and partly in cross section, a portion of the protective member forming apparatus illustrated in FIG. 1.

The protective member forming apparatus, which is denoted by 1 in FIG. 1, according to the present embodiment is an apparatus that forms a protective member 210 illustrated in FIG. 3 to a desired thickness on a face side 203 as one of the surfaces of a workpiece 200 illustrated in FIG. 2. As illustrated in FIGS. 2 and 3, the workpiece 200 includes a semiconductor wafer, an optical device wafer, or the like shaped as a circular plate including a substrate 201 made of silicon (Si), sapphire (Al$_2$O$_3$), gallium arsenide (GaAs), silicon carbide (SiC), or the like.

As illustrated in FIG. 2, the workpiece 200 includes a plurality of devices 204 formed in respective areas demarcated on the face side 203 by a grid of intersecting projected dicing lines 202. As illustrated in FIG. 3, the devices 204 have bumps 205 that protrude from the face side 203 and are connected to electrodes of the devices 204. The devices 204 may include, for example, circuits such as integrated circuits (ICs) or large scale integration (LSI) circuits, image sensors such as charge coupled devices (CCDs) or complementary metal oxide semiconductors (CMOS), or microelectromechanical systems (MEMS). The bumps 205 are made of electrically conductive metal and are of a spherical shape in the present embodiment.

The bumps 205 are used to electrically connect the devices 204 to electrodes on boards or the like on which the devices 204 are to be installed. According to the present embodiment, the bumps 205 protruding from the face side 203 of the workpiece 200 provide surface irregularities on the face side 203. Further, according to the present embodiment, while the workpiece 200 is illustrated as having the surface irregularities provided by the bumps 205 on the face side 203 in the present embodiment, the workpiece 200 may also be free of the bumps 205. According to the present invention, further, the workpiece 200 is not limited to a wafer and may be a rectangular resin-packaged substrate, a ceramic plate, a glass plate, or the like that has a plurality of devices encapsulated by a resin.

According to the present embodiment, the workpiece 200 includes a functional layer 206 layered on a surface of the substrate 201. The functional layer 206, whose outer surface defines the face side 203, includes a low-dielectric-constant insulating film (hereinafter referred to as a "Low-k" film) and an electrically conductive film. The Low-k film includes an inorganic film of SiOF, BSG (SiOB), or the like or an organic film that is also referred to as a polymer film and is made of polyimide, parylene, or the like. The electrically conductive film is made of electrically conductive metal. The Low-k film and the electrically conductive film are layered together in forming the devices 204. The electrically conductive film provides circuits of the devices 204. Specifically, the devices 204 include Low-k films that are layered together and an electrically conductive film that is layered between the Low-k films. It is to be noted that the functional layer 206 in the projected dicing lines 202 includes Low-k layers but lacks an electrically conductive film except in a test element group (TEG). The TEG includes assessment elements for finding design and fabrication problems that may arise in the devices 204.

According to the present embodiment, the protective member 210 is formed on the face side 203 of the workpiece 200. While the face side 203 of the workpiece 200 is being held on a chuck table of a grinding apparatus with the protective member 210 interposed therebetween, the grinding apparatus grinds a reverse side 207 of the workpiece 200 that is opposite the face side 203, thereby thinning down the workpiece 200 to a predetermined finished thickness. After being thinned down, the workpiece 200 is divided along the projected dicing lines 202 into individual device chips including the respective devices 204.

According to the present embodiment, as illustrated in FIG. 3, the protective member 210 includes a resin film 211, a resin layer 212, and a resin sheet 213 (which corresponds to a sheet) and hence includes two or more layers of resin. According to the present embodiment, the resin film 211 is constructed as a thin flexible film made of a synthetic resin (polyolefin (PO) in the present embodiment) and is formed as a sheet. The resin film 211 is held in intimate contact with and affixed to the face side 203 of the workpiece 200 and the surfaces of the bumps 205.

According to the present embodiment, the resin layer 212 is made of a liquid resin 214 (see FIG. 1) that is curable by an external stimulus and is layered on the resin film 211. The liquid resin 214 that will form the resin layer 212 includes an ultraviolet-curable liquid resin that is curable by an ultraviolet radiation as the external stimulus. According to the present invention, however, the liquid resin 214 is not limited to such an ultraviolet-curable liquid resin and may be a liquid resin that is curable when being heated, for example. The liquid resin 214 may be, for example, ResiFlat manufactured by DISCO Corporation or TEMPLOC manufactured by Denka Company Limited.

The resin sheet 213 is in the form of a thin flexible film made of a synthetic resin (polyolefin (PO) in the present embodiment) through which ultraviolet rays are transmittable. The resin sheet 213 is layered on the resin layer 212. The resin layer 212 is produced when the liquid resin 214 layered between the resin film 211 and the resin sheet 213 is cured by an external stimulus applied thereto. The thickness of the protective member 210 and the workpiece 200 combined together remains uniform entirely over the face side 203.

In addition, according to the present embodiment, the protective member 210 is formed on the workpiece 200 by the protective member forming apparatus 1 in such a manner that the workpiece 200 is included in a frame unit 215 illustrated in FIGS. 4 and 5. It is to be noted that the frame unit 215 includes the resin film 211 shaped as a circular plate larger in diameter than the workpiece 200 and held in intimate contact with the face side 203 of the workpiece 200 and the surfaces of the bumps 205 without gaps therebetween. The resin film 211 has an outer circumferential edge portion to which an annular frame 216 is affixed.

As illustrated in FIG. 1, the protective member forming apparatus 1 according to the present embodiment includes an ultraviolet radiation applying table 10, a resin supply unit 20, a pressing unit 30, a light blocking cover 40, a light blocking shutter 41, a delivery unit 50, an ionizer unit 60, and a control unit 100.

The ultraviolet radiation applying table 10 is of a rectangular shape whose planar shape is larger than the planar shape of the frame unit 215. As illustrated in FIG. 1, the ultraviolet radiation applying table 10 includes a frame body 11, a support plate 12, and an ultraviolet radiation source 13. The frame body 11 includes a bottom plate 111 that is of a rectangular shape whose planar shape is larger than the planar shape of the frame unit 215 and a frame portion 112 that is erected from an outer edge of the bottom plate 111. The frame body 11 is made of a metal such as stainless steel, for example.

The support plate 12 is of a rectangular shape whose planar shape is larger than the planar shape of the frame unit 215, and is attached to an inner side of the frame portion 112 of the frame body 11. The support plate 12 is shaped as a flat plate having a constant thickness. The support plate 12 has an upper surface acting as a support surface 121 that is flat along horizontal directions. The support plate 12 is made of a light-transmissive material such as glass and allows ultraviolet rays to be transmitted therethrough. The resin sheet 213, which is of a rectangular shape whose planar shape is larger than the planar shape of the frame unit 215, i.e., the workpiece 200, is placed on the support surface 121 of the support plate 12. The support plate 12 supports the resin sheet 213 on the support surface 121.

The ultraviolet radiation source 13 is disposed over the bottom plate 111 of the frame body 11 and beneath the support plate 12 within the ultraviolet radiation applying table 10. The ultraviolet radiation source 13 includes an ultraviolet lamp for emitting ultraviolet rays. The ultraviolet radiation applying table 10 thus supports the resin sheet 213 on the support surface 121 of the support plate 12 through which ultraviolet rays emitted from the ultraviolet radiation source 13 disposed in the ultraviolet radiation applying table 10 are transmitted.

The resin supply unit 20 supplies the liquid resin 214 from a liquid resin supply source, which is not illustrated, onto the surface of the resin sheet 213 placed on the support surface 121. The resin supply unit 20 includes a supply pipe 21 that is used for supplying the liquid resin 214 from the liquid resin supply source and a nozzle 22 that is mounted on the distal end of the supply pipe 21 and has a discharge port for spouting the liquid resin 214 onto the resin sheet 213. The resin supply unit 20 is movable by a moving mechanism, which is not illustrated, between a resin supply position and a retracted position. The resin supply position is a position in which the nozzle 22 vertically faces a central area of the support surface 121 of the ultraviolet radiation applying table 10. The retracted position is a position in which the nozzle 22 is retracted out of a space above the support surface 121 of the ultraviolet radiation applying table 10. The resin supply unit 20 supplies the liquid resin 214 from the nozzle 22 that is positioned in the resin supply position, onto the surface of the resin sheet 213 that is supported on the support surface 121 of the ultraviolet radiation applying table 10.

The pressing unit 30 presses the workpiece 200 from the reverse side 207 thereof that is opposite the face side 203, toward the liquid resin 214 supplied to the surface of the resin sheet 213 placed on the support surface 121. The pressing unit 30 includes a holding member 31, a lifting and lowering member 32 mounted on the holding member 31, and a feed unit 33.

The holding member 31 has a lower surface 311 lying flat along horizontal directions and having a rectangular shape whose planar shape is equal in size to the planar shape of the ultraviolet radiation applying table 10. The holding member 31 is disposed above the ultraviolet radiation applying table 10, with the lower surface 311 vertically facing the support surface 121. The holding member 31 has a plurality of suction holes defined therein. The suction holes are connected to a suction source, which is not illustrated, and are opened at the lower surface 311. When the suction holes are evacuated by the suction source, the holding member 31 attracts and supports the workpiece 200 under suction on the lower surface 311. According to the present embodiment, the holding member 31 attracts and supports the annular frame 216 of the frame unit 215 and the reverse side 207 of the workpiece 200 under suction on the lower surface 311.

The lifting and lowering member 32 is fixed to an upper surface of the holding member 31. The feed unit 33 includes a known ball screw 34, an electric motor 35, and known guide rails. The ball screw 34 extends parallel to vertical directions, is rotatable about a vertical central axis, and is operatively threaded through an internally threaded hole in the lifting and lowering member 32. The electric motor 35 is mounted on an apparatus body, which is not illustrated, and is coupled to an end of the ball screw 34 to rotate the ball screw 34 about its central axis, thereby lifting or lowering the holding member 31 along the vertical directions. The guide rails, which are not illustrated, are mounted on the apparatus body to guide the lifting and lowering member 32 movably supported thereon for movement along the vertical directions.

When the feed unit 33 rotates the ball screw 34 about its central axis, the pressing unit 30 presses the workpiece 200 held under suction on the lower surface 311 of the holding member 31, toward the liquid resin 214 supplied to the resin sheet 213 held on the ultraviolet radiation applying table 10.

According to the present embodiment, the light blocking cover 40 includes a light blocking member that is of a C-shaped planar shape, as illustrated in FIG. 6. The light blocking cover 40 houses the ultraviolet radiation applying table 10 positioned therein and covers a space 42 above the support surface 121. Therefore, the light blocking member as the light blocking cover 40 covers the space 42 above the support surface 121 of the ultraviolet radiation applying table 10. The light blocking cover 40 is made of a light blocking material (that is particularly capable of limiting the transmission of ultraviolet rays therethrough). It is to be noted that the space 42 is also a space defined in the light blocking cover 40.

According to the present embodiment, as illustrated in FIG. 1, the light blocking cover 40 covers a region between the support surface 121 of the ultraviolet radiation applying table 10 and the lower surface 311 of the holding member 31 of the pressing unit 30 that is spaced from the ultraviolet radiation applying table 10. Further, since the light blocking cover 40 is of a C-shaped planar shape, the light blocking cover 40 has an opening 43 (that is defined in a portion thereof) as illustrated in FIG. 6. The opening 43 provides fluid communication between the outside and inside of the light blocking cover 40.

Figure 8:
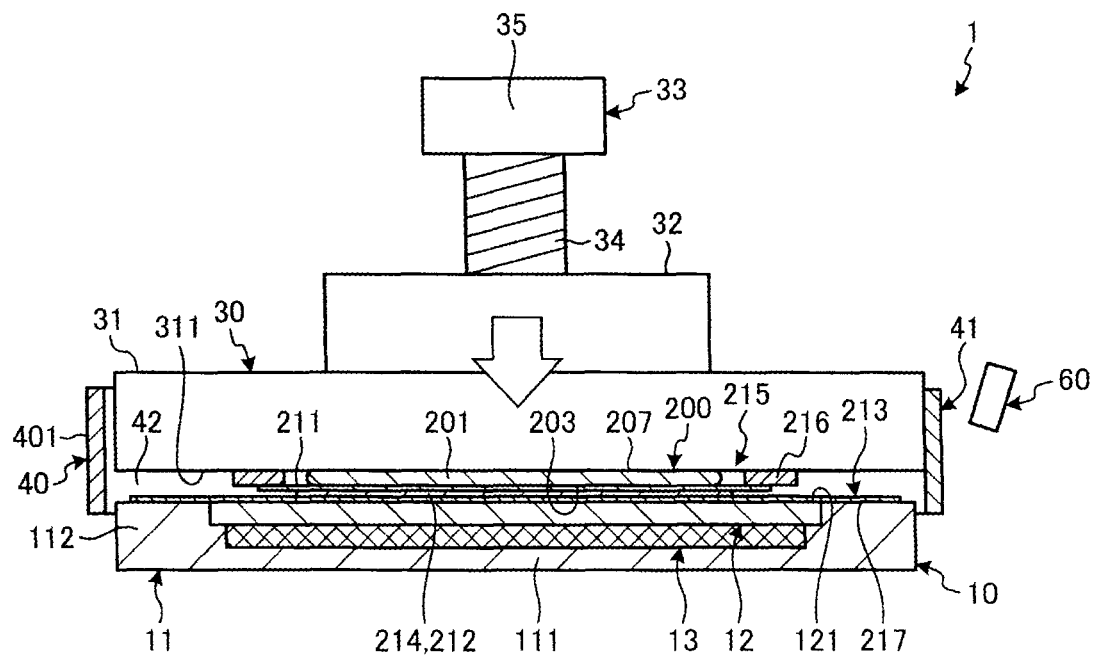
FIG. 8 is a side elevational view, partly in cross section, schematically illustrating the manner in which a pressing unit of the protective member forming apparatus illustrated in FIG. 1 is pressing the workpiece against the liquid resin.

The light blocking shutter 41 is shaped as a flat plate whose thickness is equal to the thickness of the light blocking cover 40, and is made of a light blocking material (that is particularly capable of limiting the transmission of ultraviolet rays therethrough). The light blocking shutter 41 is movable by a moving mechanism, which is not illustrated, between a closing position and an opening position. The closing position is a position in which the light blocking shutter 41 closes the opening 43, as illustrated in FIG. 8, etc. The opening position is a position in which the light blocking shutter 41 opens the opening 43, as illustrated in FIG. 1, etc. The light blocking shutter 41 selectively opens and closes the opening 43 of the light blocking cover 40 when the light blocking shutter 41 is moved between the opening position and the closing position by the moving mechanism.

According to the present embodiment, the light blocking shutter 41 is disposed parallel to a wall 401 of the light blocking cover 40 that is farthest from the opening 43. The light blocking shutter 41 is movable between the opening position and the closing position when the light blocking shutter 41 is slid vertically by the moving mechanism. When being placed in the opening position, the light blocking shutter 41 allows the delivery unit 50 to enter the space 42 near the support surface 121 in the light blocking cover 40.

The delivery unit 50 acts a sheet placement unit that, while holding the resin sheet 213 thereon, enters the space 42 near the support surface 121 in the light blocking cover 40 through the opening 43 from outside of the light blocking cover 40, and then places the resin sheet 213 onto the support surface 121. The delivery unit 50 also acts an unloading unit that holds the resin sheet 213 to which the workpiece 200 has been fixed by the liquid resin 214 cured by ultraviolet rays applied thereto, and unloads the resin sheet 213 from the ultraviolet radiation applying table 10 through the opening 43 out of the light blocking cover 40.

According to the present embodiment, the delivery unit 50 includes a plurality of suction pads 51, a holding member 52 holding the suction pads 51, and an unillustrated moving unit that moves the holding member 52 in vertical directions and horizontal directions. The suction pads 51 include non-contact-type Bernoulli pads that are disposed on respective corners of the holding member 52 or the like and eject a pressurized gas to hold the resin sheet 213 out of contact therewith under a negative pressure of the gas. According to the present embodiment, the delivery unit 50 also includes an unillustrated frame holder that holds, under suction, the annular frame 216 of the frame unit 215 fixed to the resin sheet 213.

The ionizer unit 60 ejects ionized air 61 (illustrated in FIG. 6) to the support surface 121 of the ultraviolet radiation applying table 10 to neutralize electrical charges of the support surface 121, thereby removing the static electricity from the support surface 121. According to the present embodiment, the ionizer unit 60 is of the bar type that includes an ionizer for ejecting ionized air 61 to the upper surface of an end portion 217 (see FIG. 6 or the like) of the resin sheet 213 on the support surface 121 that is close to the light blocking shutter 41, over the entire length of the end portion 217 in the widthwise directions of the resin sheet 213.

According to the present embodiment, the ionizer unit 60 includes an ejection port for ejecting ionized air 61, the ejection port extending straight parallel to the light blocking shutter 41 placed in the opening position. The ionizer unit 60 is disposed at a height equal in the vertical directions to the light blocking shutter 41 placed in the opening position, and ejects ionized air 61 toward the upper surface of the end portion 217 of the resin sheet 213 on the support surface 121. The ionizer unit 60 ejects the ionized air 61 in a direction inclined vertically progressively into the space 42 in a downward direction as viewed sideways. Therefore, part of the ionized air 61 ejected from the ionizer unit 60 is oriented to press the end portion 217 of the resin sheet 213 on the support surface 121 against the side of the support surface 121. It is to be noted that the end portion 217 of the resin sheet 213 on the support surface 121 refers to an end region of the resin sheet 213 that is close to the light blocking shutter 41.

The control unit 100 controls the various components of the protective member forming apparatus 1 to enable the protective member forming apparatus 1 to perform a protective member forming step of forming the protective member 210 on the face side 203 of the workpiece 200. The control unit 100 includes a computer including a processing device having a microprocessor such as a central processing unit (CPU), a storage device having a memory such as a read only memory (ROM) or a random access memory (RAM), and an input/output interface device. The computer is able to execute computer programs.

The processing device of the control unit 100 executes, on the RAM, computer programs stored in the ROM to generate control signals for controlling the protective member forming apparatus 1. The processing device of the control unit 100 outputs the generated control signals through the input/output interface device to the components of the protective member forming apparatus 1.

Further, the control unit 100 is connected to an unillustrated display unit such as a liquid crystal display device that displays states and images of a processing operation, and to an unillustrated input unit used by the operator to enter processing contents information. The input unit includes at least one of a touch panel incorporated in the display unit, a keyboard, and so on.

Figure 7:
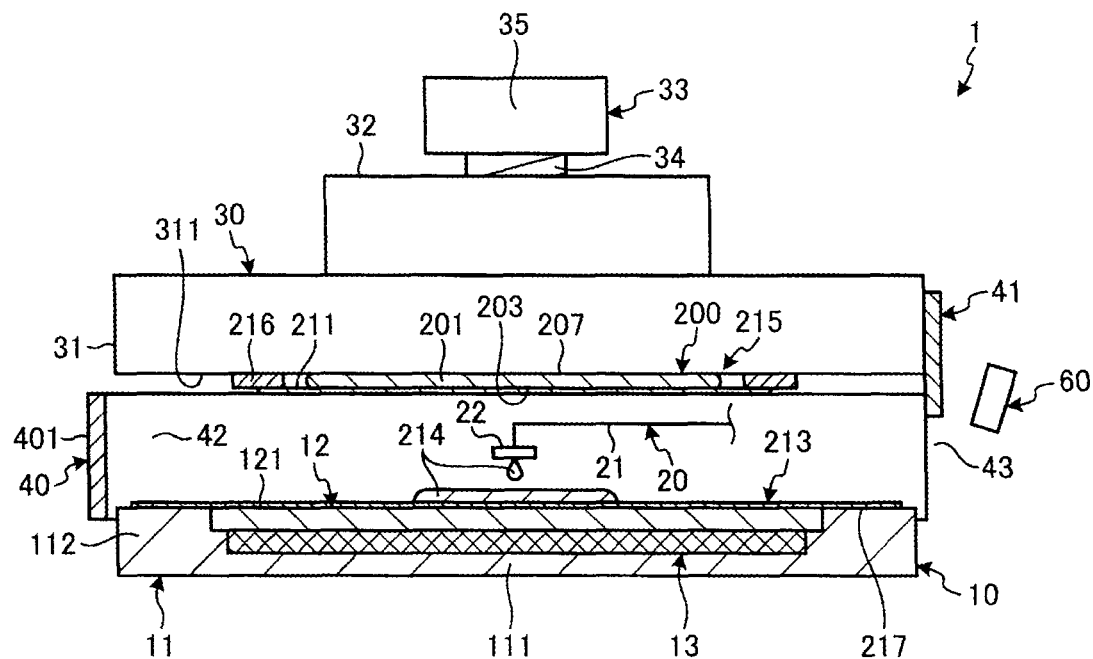
FIG. 7 is a side elevational view, partly in cross section, schematically illustrating the manner in which a resin supply unit of the protective member forming apparatus illustrated in FIG. 1 has supplied a liquid resin onto a surface of a resin sheet on a support surface.
Figure 9:
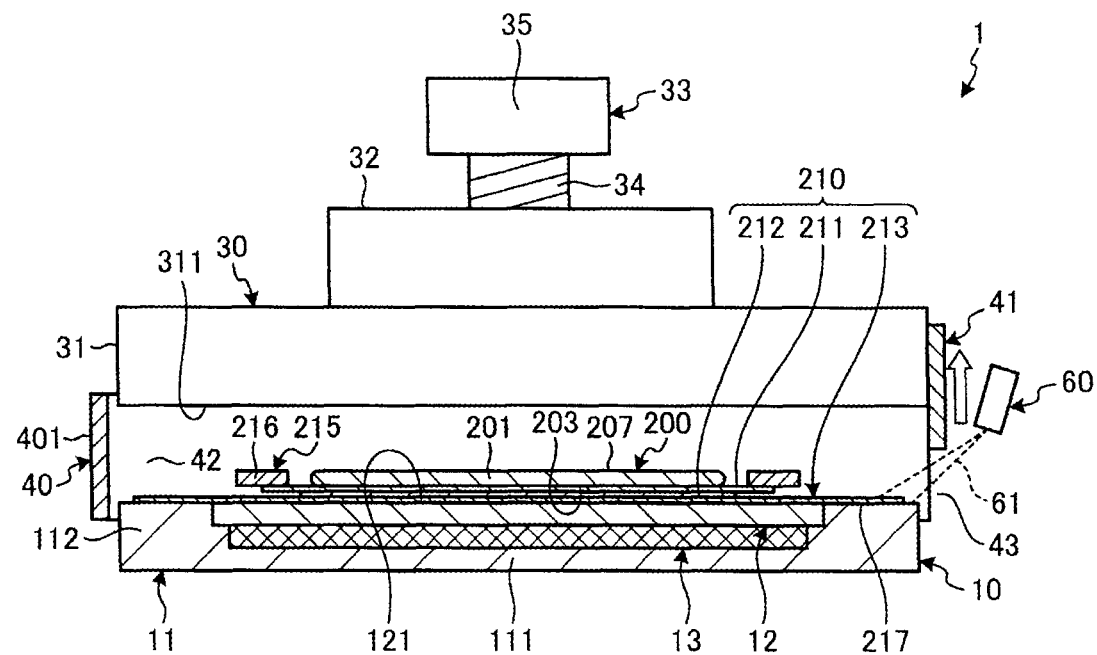
FIG. 9 is a side elevational view, partly in cross section, schematically illustrating the manner in which an ionizer unit of the protective member forming apparatus illustrated in FIG. 1 is ejecting ionized air to an end of the resin sheet on the support surface.
Figure 10:
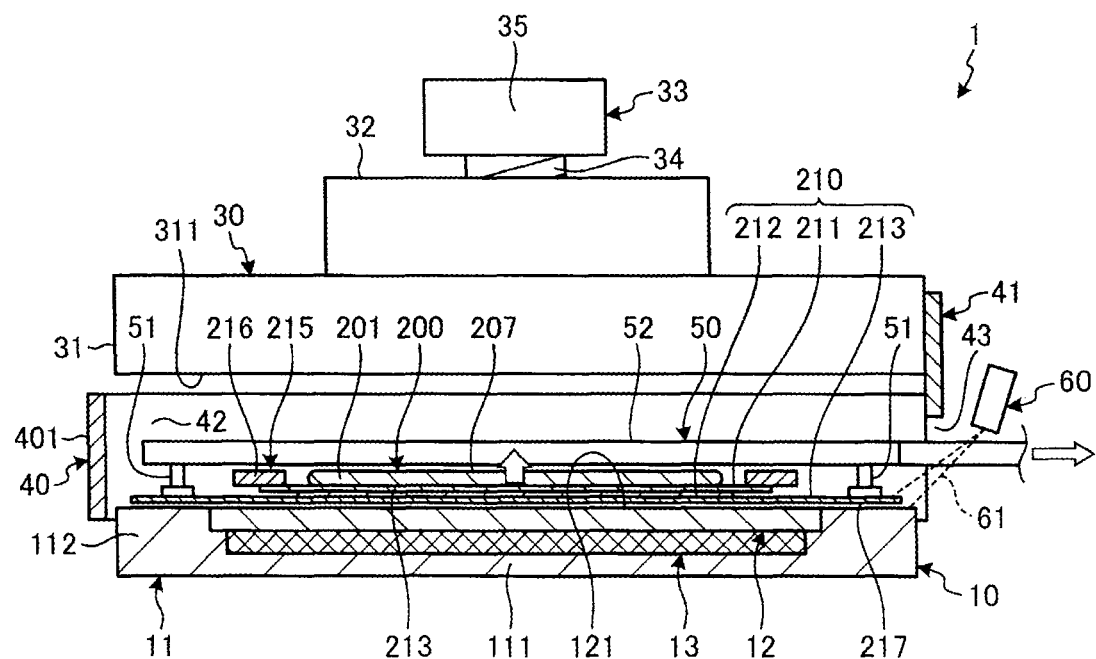
FIG. 10 is a side elevational view, partly in cross section, schematically illustrating the manner in which a delivery unit of the protective member forming apparatus illustrated in FIG. 1 unloads the workpiece by holding the resin sheet on the support surface.

A protective member forming step carried out by the protective member forming apparatus 1 configured as described above will be described below with reference to the drawings. FIG. 7 schematically illustrates, in side elevation and partly in cross section, the manner in which the resin supply unit of the protective member forming apparatus illustrated in FIG. 1 has supplied a liquid resin onto a surface of a resin sheet on a support surface. FIG. 8 schematically illustrates, in side elevation and partly in cross section, the manner in which the pressing unit of the protective member forming apparatus illustrated in FIG. 1 is pressing the workpiece against the liquid resin. FIG. 9 schematically illustrates, in side elevation and partly in cross section, the manner in which the ionizer unit of the protective member forming apparatus illustrated in FIG. 1 is ejecting ionized air to an end of the resin sheet on the support surface. FIG. 10 schematically illustrates, in side elevation and partly in cross section, the manner in which the delivery unit of the protective member forming apparatus illustrated in FIG. 1 unloads the workpiece by holding the resin sheet on the support surface.

The protective member forming apparatus 1 configured as described above performs a protective member forming step to form the protective member 210 when the control unit 100 controls the components of the protective member forming apparatus 1. In the protective member forming step, the pressing unit 30 where the annular frame 216 of the frame unit 215 and the reverse side 207 of the workpiece 200 are held under suction on the lower surface 311 of the holding member 31 is placed in a position spaced from the support surface 121. The light blocking shutter 41 is placed in the opening position to open the opening 43, and the delivery unit 50 delivers the resin sheet 213 held by the suction pads 51, into the space 42. The resin sheet 213 is placed on the support surface 121 of the support plate 12 of the ultraviolet radiation applying table 10 and supported on the support surface 121. At this time, the resin sheet 213 has an outer peripheral portion placed on the upper surface of the frame portion 112 of the frame body 11. The support surface 121 and the upper surface of the frame portion 112 may jointly be referred to as a support surface for the resin sheet 213. The nozzle 22 of the resin supply unit 20 is placed in the resin supply position, and then, as illustrated in FIG. 7, supplies a predetermined amount of liquid resin 214 onto the resin sheet 213.

In the protective member forming step, thereafter, the nozzle 22 of the resin supply unit 20 is moved to the retracted position, and the light blocking shutter 41 is placed in the closing position to close the opening 43. Then, the holding member 31 of the pressing unit 30 is lowered to lower the workpiece 200 held under suction on the holding member 31, toward a position where a protective member 210 to be formed will be of a predetermined thickness. The face side 203 of the workpiece 200 is then brought into contact with the liquid resin 214 on the resin sheet 213 with the resin film 211 interposed therebetween, and the liquid resin 214 is radially outwardly spread toward an outer peripheral edge of the resin sheet 213 upon descent of the workpiece 200. When the workpiece 200 is lowered to reach the position where a protective member 210 to be formed will be of a predetermined thickness, as illustrated in FIG. 8, the liquid resin 214 is held in intimate contact with the resin sheet 213 and the resin film 211 and covers the entire face side 203 of the workpiece 200 with the resin film 211 interposed therebetween.

In the protective member forming step, the holding member 31 stops being lowered at position where a protective member 210 to be formed will be of a predetermined thickness. Then, the ultraviolet radiation source 13 emits and applies ultraviolet rays through the support plate 12 and the resin sheet 213 to the liquid resin 214 for a predetermined period of time. Upon exposure to the ultraviolet rays, the liquid resin 214 is cured into the resin layer 212, thereby forming the protective member 210 of the desired thickness on the face side 203 of the workpiece 200. The workpiece 200 is now fixed to the resin sheet 213 by the cured liquid resin 214, i.e., the resin layer 212, and the resin film 211. The holding member 31 then stops holding the frame unit 215 under suction. The ultraviolet radiation applying table 10 now supports the workpiece 200 on the support surface 121 of the support plate 12 through which the ultraviolet rays from the ultraviolet radiation source 13 in the frame body 11 are transmitted.

In the protective member forming step, the holding member 31 of the pressing unit 30 is lifted, and the light blocking shutter 41 is placed in the opening position to open the opening 43. Then, as illustrated in FIG. 9, the ionizer unit 60 ejects ionized air 61 into the opening 43. Even if a gas flows through the opening 43 into the space 42 when the light blocking shutter 41 opens the opening 43, the ionized air 61 ejected from the ionizer unit 60 presses the end portion 217 of the resin sheet 213 against the upper surface of the frame portion 112, thereby holding the end portion 217 of the resin sheet 213 against being lifted off the frame portion 112. Therefore, when the light blocking shutter 41 opens the opening 43, part of the ionized air 61 ejected from the ionizer unit 60 is oriented to press the end portion 217 of the resin sheet 213 against the upper surface of the frame portion 112. Further, even if the support surface 121 of the support plate 12 has been electrically charged, the ejected ionized air 61 neutralizes electrical charges of the support surface 121, thereby removing the static electricity from the support surface 121.

In the protective member forming step, the delivery unit 50 is inserted through the opening 43 into the space 42 in the light blocking cover 40, and the suction pads 51 of the delivery unit 50 hold the resin sheet 213 on the support surface 121 under suction. As illustrated in FIG. 10, in the protective member forming step, the delivery unit 50 whose suction pads 51 have held the resin sheet 213 on the support surface 121 under suction is lifted in the space 42 in the light blocking cover 40 to lift the resin sheet 213 off the support surface 121. The ionized air 61 ejected from the ionizer unit 60 is introduced along the support surface 121 into the gap between the resin sheet 213 and the support surface 121, and electrical charges of the support surface 121 in its entirety are neutralized, thereby removing the static electricity from the support surface 121. In this manner, at the time when the resin sheet 213 is spaced from the support surface 121 by the delivery unit 50, the ionized air 61 is introduced along the support surface 121 into the gap between the resin sheet 213 and the support surface 121.

In the protective member forming step, thereafter, the delivery unit 50 is moved through the opening 43 out of the space 42 in the light blocking cover 40 to unload the workpiece 200 with the protective member 210 formed thereon out of the light blocking cover 40. The protective member forming step is now finished. It is to be noted that the workpiece 200 unloaded out of the light blocking cover 40 is processed in a cutting step where the resin film 211, the resin layer 212, and the resin sheet 213, i.e., the protective member 210, are severed along an outer edge of the workpiece 200.

The protective member forming apparatus 1 according to the present embodiment is advantageous in that, when the resin sheet 213 is spaced from the support surface 121 by the delivery unit 50, since the ionized air 61 is introduced into the gap between the resin sheet 213 and the support surface 121, the support surface 121 is restrained from being electrically charged, allowing the workpiece 200 with the protective member 210 formed thereon to be unloaded easily.

As a result, the protective member forming apparatus 1 is capable of reducing the difficulty in unloading the workpiece 200 with the protective member 210 formed on the face side 203 thereof.

Further, the protective member forming apparatus 1 includes the light blocking cover 40 and the light blocking shutter 41 for blocking ultraviolet rays emitted from the ultraviolet radiation applying table 10. In order to prevent a gas flowing into the light blocking cover 40 from flapping the end portion 217 of the resin sheet 213 when the light blocking shutter 41 opens the opening 43, and to prevent the delivery unit 50 from failing to hold the resin sheet 213, the ionized air 61 is applied to the upper surface of the end portion 217 of the resin sheet 213 near the light blocking shutter 41 to thereby keep the end portion 217 in contact with the frame portion 112. In the case where the protective member forming apparatus 1 includes a fan filter unit (FFU) that supplies filtered clean air outside of the light blocking shutter 41, it is liable to generate an air stream flowing into the light blocking cover 40 at the time when the light blocking shutter 41 opens the opening 43, tending to flap the end portion 217 of the resin sheet 213. According to the present embodiment, however, since the ionizer unit 60 applies ionized air 61 to the upper surface of the end portion 217 of the resin sheet 213 near the light blocking shutter 41, the end portion 217 is prevented from being flapped.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A protective member forming apparatus that forms a protective member on a surface of a plate-shaped workpiece, the protective member forming apparatus comprising:
    an ultraviolet radiation applying table that supports the workpiece on a support surface of a support plate of the ultraviolet radiation applying table, the support plate being configured such that ultraviolet rays from an ultraviolet radiation source disposed in the ultraviolet radiation applying table are transmittable through the support plate;
    a sheet placement unit that places, on the support surface, a sheet that is larger than the workpiece and through which the ultraviolet rays are transmittable;
    a resin supply unit that supplies an ultraviolet-curable liquid resin to the sheet placed on the support surface;
    a pressing unit that presses the workpiece from another surface of the workpiece toward the liquid resin supplied to the sheet placed on the support surface;
    an unloading unit that holds the sheet to which the workpiece is fixed with the liquid resin cured by the ultraviolet rays being interposed between the sheet and the workpiece, and unloads the workpiece from the ultraviolet radiation applying table;
    a light blocking cover including a light blocking member and an opening to a space over the support surface of the ultraviolet radiation applying table, said light blocking member covers the opening to the space;
    a light blocking shutter that opens and closes a portion of the light blocking cover to allow the unloading unit to enter the space,
    wherein, when the light blocking shutter opens the portion of the light blocking cover, part of the ionized air ejected from the ionizer unit is applied in such an orientation as to press an end region of the sheet near the light blocking shutter against the support surface, and
    an ionizer unit positioned adjacent to the opening and configured to eject ionized air through the opening and into the space over the support surface of the ultraviolet radiation applying table,
    wherein, when the sheet is spaced from the support surface by the unloading unit, the ionized air ejected from the ionizer unit is introduced along the support surface into a gap between the sheet and the support surface.

2. The protective member forming apparatus according to claim 1, wherein the light blocking member has a C-shape with the opening, wherein the light blocking member covers the space over the support surface of the ultraviolet radiation applying table; and
    the light blocking shutter having a flat plate that opens and closes the opening of the light blocking member to allow the unloading unit to enter the space,
    wherein, when the light blocking shutter opens the opening of the light blocking cover, part of the ionized air ejected from the ionizer unit is applied in such an orientation as to press an end region of the sheet near the light blocking shutter against the support surface.

3. The protective member forming apparatus according to claim 1, wherein, when the light blocking shutter opens the portion of the light blocking cover, the ionizer unit ejects the ionized air.

4. The protective member forming apparatus according to claim 1, wherein the ionizer unit is disposed outside of the light blocking cover and ejects the ionized air from the outside of the light blocking cover toward the space.

5. The protective member forming apparatus according to claim 1, wherein said resin film has a diameter that is greater than a diameter of the workpiece.

* * * * *